US012803573B2

(12) United States Patent
Lee et al.

(10) Patent No.: US 12,803,573 B2
(45) Date of Patent: Nov. 17, 2026

(54) SUCCESSIVE APPROXIMATION REGISTER (SAR) ANALOG-TO-DIGITAL CONVERTERS UTILIZING SEGMENTED CAPACITIVE ANALOG-TO-DIGITAL CONVERTERS

(71) Applicant: TetraMem Inc., Fremont, CA (US)

(72) Inventors: Sangsoo Lee, Cupertino, CA (US); Wenbo Yin, Alameda, CA (US)

(73) Assignee: TetraMem Inc., San Jose, CA (US)

( * ) Notice: Subject to any disclaimer, the term of this patent is extended or adjusted under 35 U.S.C. 154(b) by 28 days.

(21) Appl. No.: 18/660,135

(22) Filed: May 9, 2024

(65) Prior Publication Data

US 2025/0350294 A1 Nov. 13, 2025

(51) Int. Cl.

*H03M 1/34* (2006.01)
*H03M 1/38* (2006.01)
*H03M 1/46* (2006.01)
*H03M 1/80* (2006.01)

(52) U.S. Cl.

CPC ............. *H03M 1/466* (2013.01); *H03M 1/38* (2013.01); *H03M 1/80* (2013.01)

(58) Field of Classification Search

CPC ...... H03M 1/466; H03M 1/468; H03M 1/667; H03M 1/442; H03M 1/445; H03M 1/38
USPC ................................. 341/144, 155, 163, 172
See application file for complete search history.

(56) References Cited

U.S. PATENT DOCUMENTS

| | | | | |
|---|---|---|---|---|
| 6,400,302 | B1 | 6/2002 | Amazeen et al. | |
| 7,834,796 | B2 * | 11/2010 | Xu | H03M 1/466 341/172 |
| 10,637,493 | B1 | 4/2020 | Geddada et al. | |
| 2010/0194619 | A1 | 8/2010 | Ohnhaeuser et al. | |
| 2011/0234433 | A1 | 9/2011 | Aruga et al. | |
| 2011/0254569 | A1 * | 10/2011 | Bogner | G01R 15/06 324/679 |
| 2012/0280841 | A1 | 11/2012 | Wang et al. | |
| 2012/0326901 | A1 * | 12/2012 | Zhao | H03M 1/06 341/172 |
| 2016/0079994 | A1 * | 3/2016 | Lee | H03M 1/46 341/118 |
| 2017/0033800 | A1 * | 2/2017 | Yuan | H03M 1/1245 |
| 2019/0131998 | A1 | 5/2019 | Fan et al. | |

* cited by examiner

*Primary Examiner* — Peguy Jean Pierre
(74) *Attorney, Agent, or Firm* — Jaffery Watson Hamilton & DeSanctis LLP

(57) ABSTRACT

In accordance with some embodiments of the present disclosure, an analog-to-digital-converter (ADC) is provided. The ADC may include a capacitive DAC (CDAC), a comparator, and a successive approximation register (SAR) logic configured to control the CDAC and the comparator to perform a successive approximation conversion of an analog input into a digital output signal. The CDAC includes a plurality of unary-weighted capacitors having the same capacitor value and a plurality of binary-weighted capacitors. In some embodiments, the CDAC includes a first capacitor array and a second capacitor array. Each of the first capacitor array and the second capacitor array may include a plurality of unary-weighted capacitors and a plurality of binary-weighted capacitors.

18 Claims, 8 Drawing Sheets

PRIOR ART

2100

200

400

SUCCESSIVE APPROXIMATION REGISTER (SAR) ANALOG-TO-DIGITAL CONVERTERS UTILIZING SEGMENTED CAPACITIVE ANALOG-TO-DIGITAL CONVERTERS

TECHNICAL FIELD

The implementations of the disclosure generally relate to electronic circuits and, more specifically, to successive approximation register (SAR) analog-to-digital converters (ADCs) utilizing a segmented capacitive digital-to-analog converter (CDAC), including an array of unary-weighted capacitors and an array of binary-weighted capacitors.

BACKGROUND

Successive approximation register (SAR) analog-to-digital converters (ADCs) are used in many low-power applications, such as IoT, wearables, and machine learning. A typical SAR ADC includes a capacitive DAC (CDAC) array, a comparator, and a control logic. The accuracy of the ADC may be limited by the linearity of the CDAC array. The CDAC is the largest contributor to the SAR ADC area. As a result, reducing the CDAC array size while maintaining good CDAC linearity is an important design consideration.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to some embodiments of the present disclosure, an apparatus implementing a SAR ADC is provided. The apparatus includes: a capacitive digital-to-analog converter (CDAC), a comparator; and a successive approximation register (SAR) logic configured to control the CDAC and the comparator to perform a successive approximation conversion of the analog input into a digital output. The CDAC includes a first capacitor array that includes a first plurality of unary-weighted capacitors having the same capacitor value and a first plurality of binary-weighted capacitors. A first input of the comparator is connected to an output voltage of the CDAC. A second input of the comparator is selectively connected to a sampled analog input.

In some embodiments, the capacitor value of the first plurality of unary-weighted capacitors is twice that of the largest capacitor of the first plurality of binary-weighted capacitors.

In some embodiments, top plates of the first plurality of unary-weighted capacitors and the first plurality of binary-weighted capacitors are connected to a common mode voltage, wherein a bottom plate of each of the first plurality of unary-weighted capacitors and the first plurality of binary-weighted capacitors is selectively connected to a first voltage or a second voltage via a first plurality of switches.

In some embodiments, the CDAC further includes a second capacitor array that includes a second plurality of unary-weighted capacitors having the same capacitor value and a second plurality of binary-weighted capacitors.

In some embodiments, the capacitor value of the second plurality of unary-weighted capacitors is twice that of the largest capacitor of the second plurality of binary-weighted capacitors.

In some embodiments, top plates of the second plurality of unary-weighted capacitors and the second plurality of binary-weighted capacitors are connected to the common mode voltage, wherein a bottom plate of each of the second plurality of unary-weighted capacitors and the second plurality of binary-weighted capacitors is selectively connected to the first voltage or the second voltage via a second plurality of switches.

In some embodiments, to perform the successive approximation conversion of the analog input into the digital output, the SAR logic is further configured to: generate a first digital code to control the bottom plates of the first plurality of unary-weighted capacitors and the first plurality of binary-weighted capacitors to be connected to the first voltage; and generate a second digital code to control the bottom plates of the second plurality of unary-weighted capacitors and the second plurality of binary-weighted capacitors to be connected to the second voltage.

In some embodiments, the comparator is configured to generate a first output indicative of whether the sampled analog input is higher than the first output voltage of the CDAC, wherein the SAR logic is configured to generate the most significant bit of the digital output based on the first output of the comparator.

In some embodiments, in view that the first output of the comparator indicates that the sampled analog input is higher than the first output voltage of the CDAC, the SAR logic is further configured to generate a third digital code to control one or more of the second plurality of unary-weighted capacitors to be connected to the first voltage.

In some embodiments, in view that the first output of the comparator indicates that the sampled analog input is not higher than the first output voltage of the CDAC, the SAR logic is further configured to generate a fourth digital code to control one or more of the first plurality of unary-weighted capacitors to be connected to the second voltage.

According to one or more aspects of the present disclosure, a method for performing analog-to-digital conversion is provided. The method includes: initializing, by a SAR logic of an analog-to-digital converter, a CDAC to produce a first reference voltage representing half of a voltage range of the analog-to-digital converter, wherein the analog-to-digital converter includes a first capacitor array and a second capacitor array, wherein the first capacitor array includes a first plurality of unary-weighted capacitors having the same capacitor value and a first plurality of binary-weighted capacitors, wherein the second capacitor array includes a second plurality of unary-weighted capacitors having the same capacitor value and a second plurality of binary-weighted capacitors, wherein a top plate of each capacitor in the CDAC is selectively connected to a common mode voltage, and wherein a bottom plate of each capacitor in the CDAC is selectively connected to a first voltage or a second voltage; generating, by a comparator of the analog-to-digital converter, a first output indicating whether an input voltage is higher than the first reference voltage; and determining the most significant bit of a digital output based on the first output of the comparator, wherein the digital output is a digital representative of the analog input, wherein the input voltage is a sampled analog input.

In some embodiments, initializing, by the SAR logic of the analog-to-digital converter, the CDAC to produce the first reference voltage representing half of the voltage range of the analog-to-digital converter includes: generating, by the SAR logic, a first digital code to control the bottom plates of the first plurality of unary-weighted capacitors and the first plurality of binary-weighted capacitors to be connected to the first voltage; and generating a second digital code to control the bottom plates of the second plurality of unary-weighted capacitors and the second plurality of binary-weighted capacitors to be connected to the second voltage.

In some embodiments, the method further includes generating, by the SAR logic, the most significant bit of the digital output based on the first output of the comparator.

In some embodiments, the method further includes in view that the first output of the comparator indicates that the sampled analog input is higher than the first output voltage of the CDAC, generating, by the SAR logic, a third digital code to control one or more of the second plurality of unary-weighted capacitors to be connected to the first voltage.

In some embodiments, the method further includes in view that the first output of the comparator indicates that the sampled analog input is not higher than the first output voltage of the CDAC, generating, by the SAR logic, a fourth digital code to control one or more of the first plurality of unary-weighted capacitors to be connected to the second voltage.

In some embodiments, the method further includes generating the second MSB of the digital output based on a second output of the comparator, wherein the second output of the comparator indicates whether the sampled analog input is higher than a second output voltage of the CDAC.

According to one or more aspects of the present disclosure, an apparatus implementing a differential SAR ADC is provided. The apparatus includes a first capacitor array comprising a first plurality of binary-weighted capacitors; a second capacitor array comprising a second plurality of binary-weighted capacitors; a comparator; and a successive approximation register (SAR) logic configured to control the first capacitor array, the second capacitor array, and the comparator to perform a successive approximation conversion of an analog input into a digital output. In some embodiments, a first input of the comparator is connected to an output voltage of the first capacitor array, wherein a second input of the comparator is connected to an output voltage of the second capacitor array.

In some embodiments, the first capacitor array further includes a first plurality of unary-weighted capacitors having the same capacitor value, and the second capacitor array further includes a second plurality of unary-weighted capacitors having the same capacitor value.

In some embodiments, the capacitor value of the first plurality of unary-weighted capacitors is twice that of the largest capacitor of the first plurality of binary-weighted capacitors.

In some embodiments, the top plates of the capacitors in the first capacitor array are selectively connected to a positive input voltage. The top plates of the capacitors in the second capacitor array are selectively connected to a negative input voltage. A differential signal representative of the analog input comprises the first positive input voltage and the second positive input voltage.

In some embodiments, the bottom plates of the first capacitor array are selectively connected to a first voltage or a second voltage via a first plurality of switches, and the bottom plates of the second capacitor array are selectively connected to the first voltage or the second voltage via a second plurality of switches.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1A:
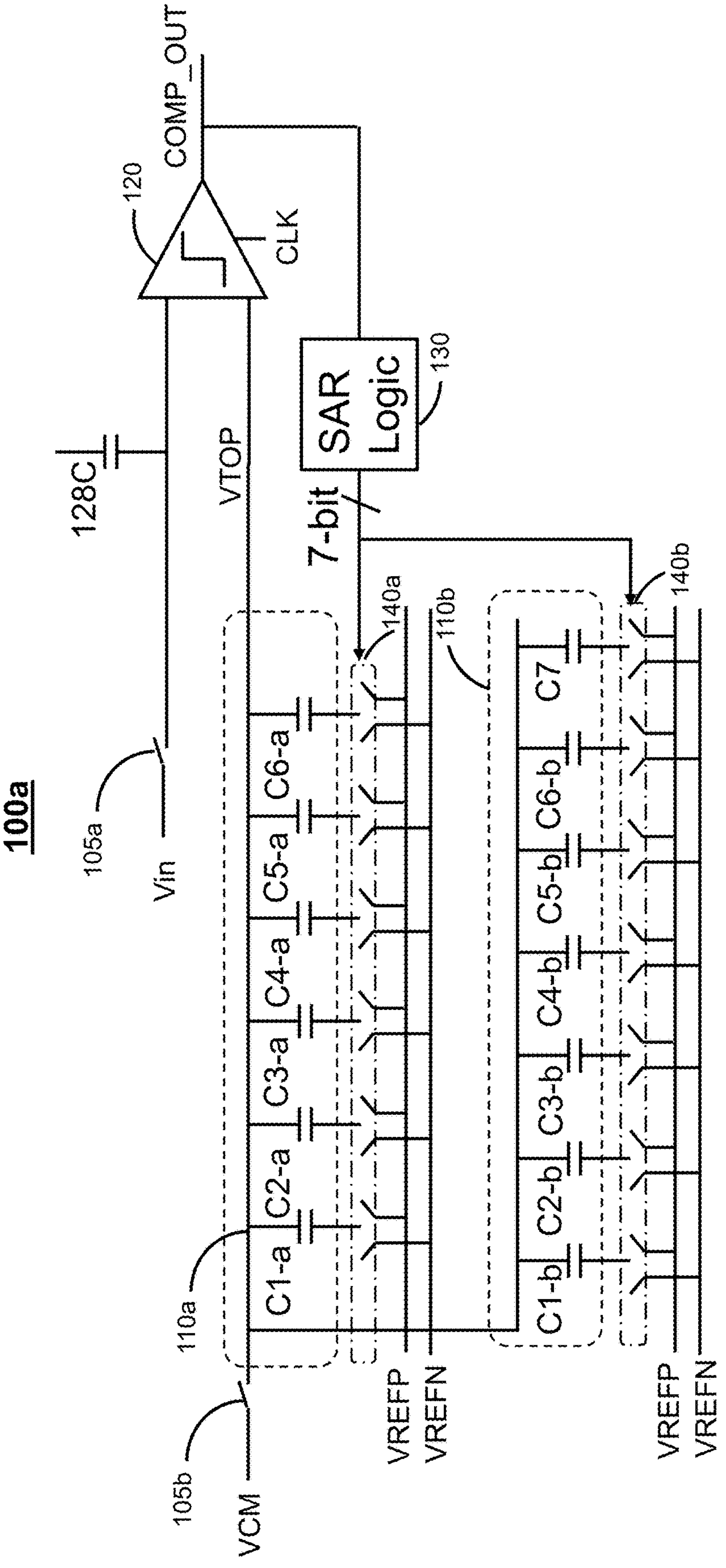
FIG. 1A is a schematic diagram illustrating an example SAR ADC utilizing a split-CDAC in accordance with some embodiments of the present disclosure.

Aspects of the disclosure provide mechanisms for performing successive approximation register (SAR) analog-to-digital conversion (ADC) utilizing a segmented capacitive DAC that may include an array of unary-weighted capacitors and an array of binary-weighted capacitors.

The conversion of an analog input into a digital output by a SAR ADC may include a sampling phase and a series of bit-cycling phases. During the sampling phase, the analog input may be sampled. During each of the series of bit-cycling phases, a subsequent bit of the digital output may be determined.

According to some aspects of the present disclosure, a SAR ADC may implement a bottom-plate sampling scheme. The SAR ADC may include a capacitive DAC (CDAC), a comparator, and a SAR logic. The CDAC may function as a voltage divider. A first input and a second input of the comparator may be selectively connected to a common-mode voltage (VCM) and an output of the CDAC (i.e., the output of the voltage divider), respectively. An n-bit SAR ADC may include an n-bit CDAC. For example, an 8-bit SAR ADC may include an 8-bit CDAC. The 8-bit CDAC may be implemented using a capacitor array of three unary-weighted capacitors and six binary-weighted capacitors. The capacitor value of each of the unary-weighted capacitors may be, for example, 64C, where C represents the unit capacitance. The capacitor values of the binary-weighted capacitors may be 32C, 16C, 8C, 4C, 2C, and C, respectively. During the sampling phase, the analog input may be connected to the bottom plates of the capacitors in the CDAC. The common mode voltage may be applied to the top plate of each of the capacitors during the sampling phase. During the bit-cycling phases, the SAR ADC may generate a plurality of successive bits by performing a successive approximation process using the CDAC. For example, the SAR logic may provide a digital code to the CDAC, causing the bottom plate of each capacitor in the CDAC to be switched to either a first voltage VREFP or a second voltage VREFN. The CDAC may function as a capacitive voltage divider and produce an output voltage based on the digital code. The comparator may compare the output voltage of the CDAC to the VCM and may generate a comparator output indicative of the result of the comparison. A bit of the digital output may be generated based on the comparator output. The SAR logic may provide another digital code to the CDAC based on the comparator output. The subsequent bits of the digital output may be generated by performing the bit-cycling process in an iterative manner.

In some embodiments, a SAR ADC may implement a top-plate sampling scheme. In such embodiments, an n-bit SAR ADC may include a (n−1)-bit CDAC, a comparator, and an SAR logic. The CDAC may include a first capacitor array and a second capacitor array. Each of the first capacitor array and the second capacitor array may include a plurality of unary-weighted capacitors and a plurality of binary-weighted capacitors. During the sampling phase, the analog input may be sampled and provided to the comparator as a first input. The top plates of the capacitors in the first capacitor array and the second capacitor array may be connected to VCM. The SAR logic may initialize the CDAC by generating digital codes that control the bottom plates of the capacitors in the first capacitor array to be connected to the first voltage and control the bottom plates of the capacitors in the second capacitor array to be connected to the second voltage. The output of the CDAC may then be provided to the comparator as a first reference voltage to generate the most significant bit (MSB) of the digital output. The first reference voltage corresponds to the midpoint of the voltage range of the ADC. During the bit-cycling phases, the subsequent bits of the digital output may be determined in a similar manner. Specifically, the SAR logic may dynamically control the CDAC to generate reference voltages that sequentially halve the current voltage range based on the values of the preceding bits of the digital output.

By utilizing a segmented CDAC array that includes unary-weighted capacitors and binary-weighted capacitors, the SAR ADCs described herein have significantly improved linearity compared to existing SAR ADCs. The mechanisms described herein can be used to implement top-plate sampling, fully differential, and/or bottom-plate sampling SAR ADCs.

FIG. 1A is a schematic diagram illustrating a SAR ADC 100*a* utilizing a single-ended split CDAC in accordance with some embodiments of the present disclosure. The split CDAC may include a first capacitor array 110*a* and a second capacitor array 110*b*. Each of the first capacitor array 110*a* and the second capacitor array 110*b* may include an array of binary-weighted capacitors with capacitor values. The capacitor values of the capacitors in the first capacitor array 110*a* may be identical to those of the corresponding capacitors of the second capacitor array 110*b*. For example, the value of the first capacitor (C1-a) in the first capacitor array 110*a* can be the same as that of the first capacitor (C1-b) in the second capacitor array 110*b*. Similarly, the value of the second capacitor (C2-a) in the first capacitor array 110*a* may be the same as that of the second capacitor (C2-b) in the second capacitor array 110*b*. Capacitors C1-a through C6-a in the first capacitor array 110*a* may have equivalent capacitor values to capacitors C1-b through C6-b in the second capacitor array 110*b*, respectively. As a more particular example, the capacitor values of C1-a, C2-a, C3-a, C4-a, C5-a, and C6-a in the first capacitor array 110*a* may be 32C, 16C, 8C, 4C, 2C, and C respectively, where C represents the unit capacitor value. The capacitor values of C1-b, C2-b, C3-b, C4-b, C5-b, C6-b, and C7 in the second capacitor array 110*b* may be 32C, 16C, 8C, 4C, 2C, C, and C, respectively.

During the sampling phase, the SAR ADC 100*a* may sample the analog input (e.g., by closing switch 105*a*) and the sampled analog input may be provided to the positive input of the comparator 120. The VCM may be sampled at the top plates of the capacitors in the CDAC (e.g., by closing switch 105*b*) and provided to the negative input of the comparator during the sampling phase. During the sampling phase, the capacitors in the first capacitor array 110*a* may be connected to the first voltage VREFP, and the capacitors in the second capacitor array 110*b* may be connected to the second voltage VREFN.

The switches 105*a* and 105*b* connecting the analog input and VCM to the comparator may then be opened to initialize the bit-cycling process. As such, the positive input of the comparator is disconnected from the analog input, and the top plates of the capacitors in the first capacitor arrays 110*a* and the second capacitor array 110*b* may be disconnected from VCM before the bit-cycling process. During the bit-cycling process, the SAR ADC 100*a* may sequentially determine the value of each bit of the digital output, starting from the MSB down to the LSB, one at a time by comparing the output voltage VTOP to the sampled analog input. For the most significant bit (MSB), if VTOP is higher than the analog input signal, the comparator output is low, and therefore, the MSB is set to "0." Meanwhile, the largest capacitor previously connected to VREFP may be connected to VREFN. If VTOP is less than the analog input signal, the MSB is set to "1." The largest capacitor previously connected to VREFN is connected to VREFP. The second MSB may then be determined in a similar manner. For example, the next largest capacitor may be disconnected from its current reference and connected to the opposite reference (VREFP to VREFN, or vice versa). The second MSB may be set to either "0" or "1" based on the result of a comparison of the output voltage VTOP and the sampled analog input voltage. ADC 100*a* may determine the value of each bit in the digital output in this manner. The combination of these bits forms the digital representation of the analog input signal.

Figure 1B:
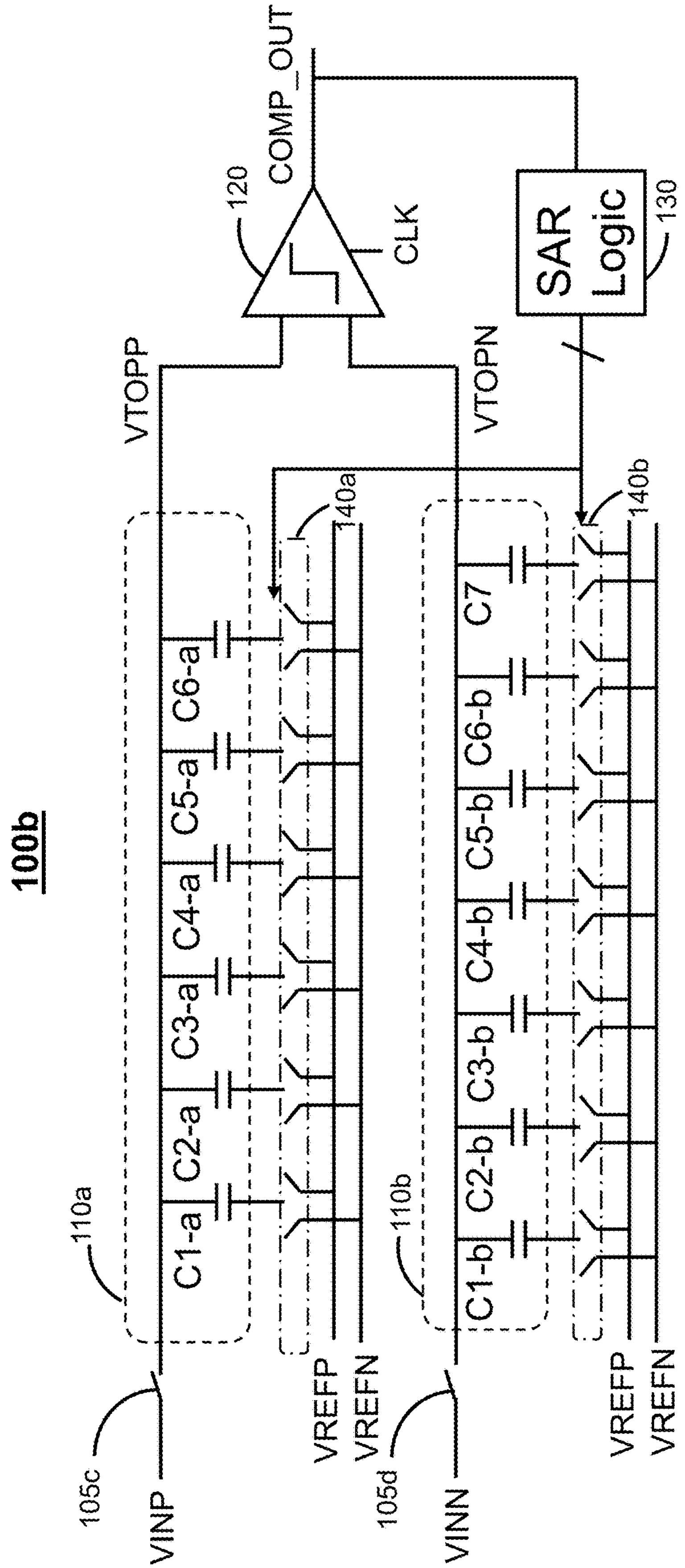
FIG. 1B is a schematic diagram illustrating an example differential SAR ADC in accordance with some embodiments of the present disclosure.

FIG. 1B is a schematic diagram illustrating an example differential SAR ADC 100*b* in accordance with some implementations of the present disclosure.

Figure 5:
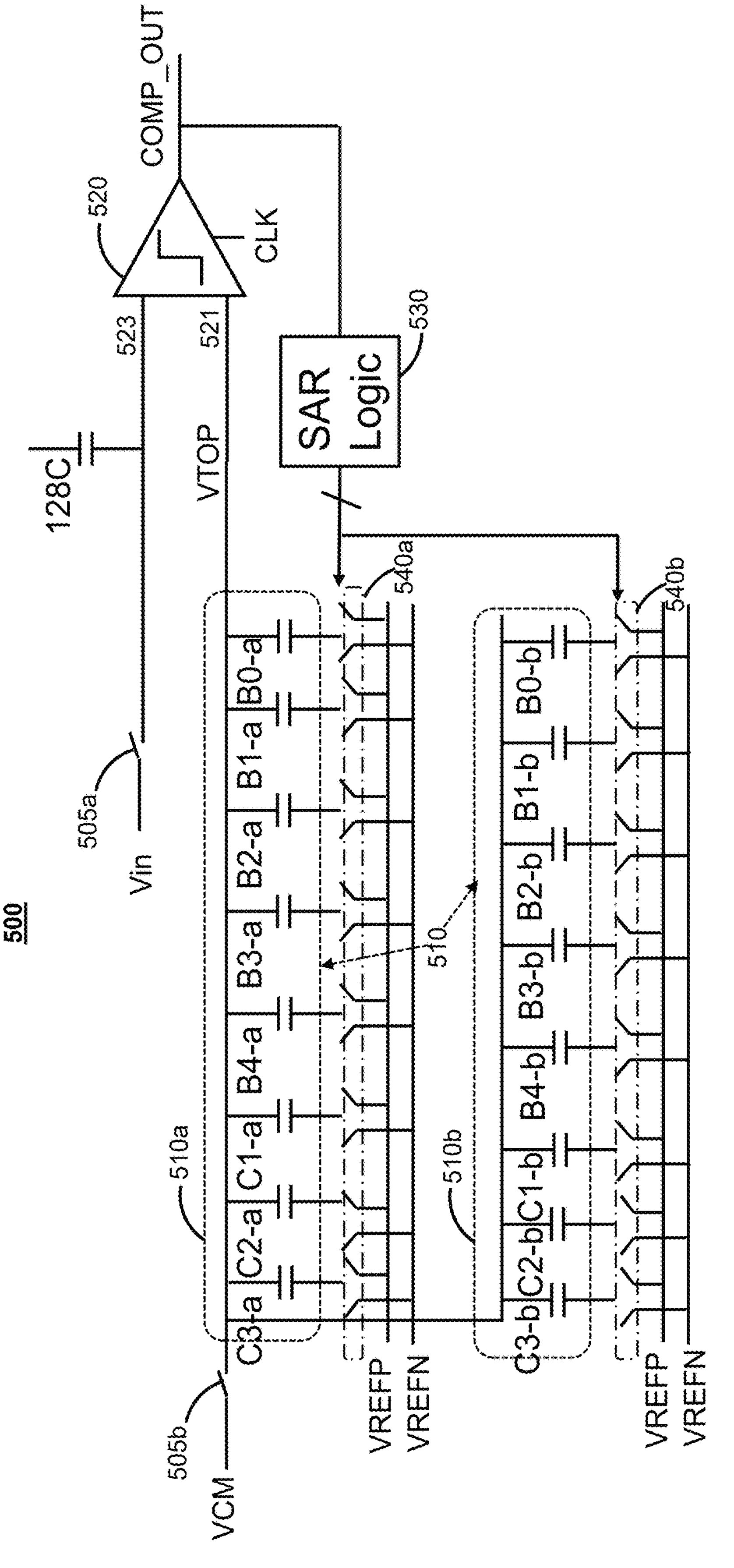
FIG. 5 is a schematic diagram illustrating an example SAR ADC in accordance with some implementations of the present disclosure.

As shown, ADC 100*b* may include the first capacitor array 110*a*, the second capacitor array 110*b*, comparator 120, SAR logic 130, switches 140*a*, and switches 140*b*. An analog input to be digitized by ADC 100*b* may be provided to ADC 100*b* as a differential signal, for example, as a positive input voltage VINP and a negative input voltage VINN. The positive input voltage VINP may be connected to the top plates of the capacitors in the first capacitor array 110*a* via a switch 105*c*. The negative input voltage VINN may be connected to the top plates of the capacitors in the second capacitor array 110*b* via a switch 105*d*. The bottom plates of the capacitors in the first capacitor array 110*a* and the second capacitor array 110*b* may be selectively connected to the first voltage VREFP or the second voltage VREFN via a first plurality of switches 140*a* and a second plurality of switches 140*b*, respectively, based on the digital codes generated by SAR logic 130. In some embodiments, the first capacitor array 110*a* and the second capacitor array 110*b* may be and/or include the capacitor array 510*a* and the capacitor array 510*b* as described in connection with FIG. 5, respectively. In particular, the first capacitor array 110*a* may include a first plurality of unary-weighted capacitors connected in parallel (e.g., capacitors C3-a, C2-a, and C1-a as shown in FIG. 5), capacitors C3-b, C2-b, and C1-b in the second capacitor array 510*b*) and a first plurality of binary-weighted capacitors connected in parallel (capacitors B4-a, B3-a, B2-a, B1-a, . . . , and B0-a as shown in FIG. 5), capacitors B4-b, B3-b, B2-b, B1-b, . . . , and B0-b in the second capacitor array 510*b*). The second capacitor array 110*b* may include a second plurality of unary-weighted capacitors connected in parallel (e.g., capacitors C3-b, C2-b, and C1-b of FIG. 5) and a second plurality of binary-weighted capacitors connected in parallel (capacitors B4-b, B3-b, B2-b, B1-b, . . . , and BG-b of FIG. 5). The first plurality of unary-weighted capacitors may have the same capacitor value. The second plurality of unary-weighted capacitors may have the same capacitor value. The binary-weighted capacitors are binary-weighted, each with a capacitor value that is twice the value of the next smaller capacitor in the array.

The output of the first capacitor array 110*a* (VTOPP) and the output of the second capacitor array 110*b* (VTOPN) may be provided to comparator 120 as a first input and a second input, respectively. The comparator 120 may compare VTOPP to VTOPN and may generate an output COMP_OUT representing the result of the comparison.

At the start of a cycle for converting the analog input signal into a digital output, half of the capacitors in the first capacitor array 110*a* may be connected to VREFP, and the other half of the capacitors in the first array 110*a* may be connected to VREFN. Similarly, half of the capacitors in the second capacitor array 110*b* may be connected to VREFP, and the other half of the capacitors in the first array 110*a* may be connected to VREFN. The SAR logic 130 may determine the value of each bit of the digital output, starting from the most significant bit (MSB) down to the least significant bit (LSB), one at a time based on the outputs of the comparator 120. For the most significant bit (MSB), if VTOPN is higher than VTOPP, the comparator output is low, and therefore, the MSB is set to "0." If VTOPP is higher than VTOPN, the comparator output is high, and therefore, the MSB is set to "1." The subsequent bits of the digital output may be determined in a similar manner. The capacitors in the first capacitor array are 110*a* and the second capacitor array 110*b* may be selectively switched between VREFP or VREFN, as described above, to perform a binary search.

Figure 2A:
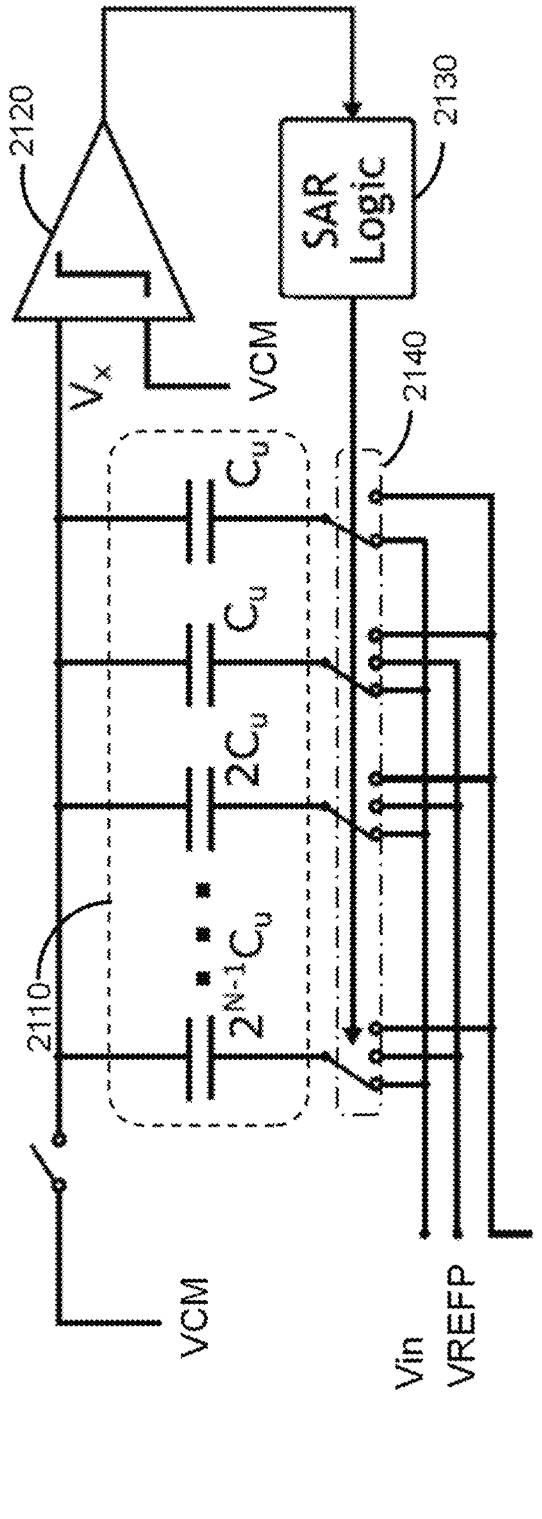
FIG. 2A is a schematic diagram illustrating a prior art SAR ADC implementing a bottom-plate sampling scheme.

FIG. 2A is a schematic diagram illustrating an existing SAR ADC 2100 based on single-ended bottom-plate input sampling. ADC 2100 may include a capacitive DAC (CDAC) 2110, a comparator 2120, a successive approximation register (SAR) logic 2130, and switches 2140. CDAC 2110 may include an array of binary-weighted capacitors $C_u$, $2C_u$, . . . , $2^{N-2}C_u$, $2^{N-1}C_u$, where each subsequent capacitor's value doubles, representing a binary-weighted scheme. For example, CDAC 2110 may include N capacitors (e.g., C1, C2, C3, C4, C5, C6, C7, and C8) to implement an N-bit (e.g., 8-bit) SAR ADC. The top plate of each capacitor in CDAC 2110 may be selectively connected to a common mode voltage (VCM). The capacitor values of the capacitors in CDAC 2110 may be 128C, 64C, 32C, 16C, 8C, 4C, 2C, and C, respectively, where C represents the unit capacitance. This provides a binary weighting to the capacitors and implements a binary search algorithm. The bottom plate of each capacitor in CDAC 2110 may be selectively connected to an analog input Vin, a first voltage (e.g., a positive reference voltage VREFP), and a second voltage (e.g., a negative reference voltage VREFN) via switches 2140. During a sampling phase, the bottom plate of each capacitor in CDAC 2110 may be connected to Vin. The switch connecting the top plate to VCM may then be opened while all the switches connecting the bottom plates are switched from the analog input Vin to VREFN. This may push the voltage on the top plate to switch from VCM to VCM−Vin.

The bit-cycling process may then be performed to sequentially determine the value of each bit of the digital output, starting from the MSB down to the LSB. In particular, the bottom plates of the capacitors may be selectively connected to VREFP or VREFN based on digital codes produced by the SAR logic. CDAC 2110 may function as a capacitive voltage divider and produce a sequence of output voltages Vx. Comparator 2120 may compare Vx to VCM and produce a comparator output COMP_OUT indicative of the results of the comparison (e.g., a high voltage or a low voltage). SAR logic 2130 may generate a bit of the digital output based on COMP_OUT and may control the next capacitor in CDAC 2110 to be connected to either VREFP or VREFN based on COMP_OUT to implement a binary search algorithm. To determine the MSB, SAR logic 2130 may control the bottom plate of the largest capacitor in CDAC 2110 ($2^{N-1}C_u$) to VREFP while maintaining the other capacitors to be connected to VREFN. The comparator may compare VTOP and VCM. If the output of capacitive DAC 2110 (VTOP) is higher than VCM, the comparator output is low, and therefore, the MSB is set to "0." Meanwhile, the bottom plate of the largest capacitor $2^{N-1}C_u$ may be switched from VREFP to VREFN. Alternatively, if the output of CDAC 2110 is lower than VCM, the MSB is set to "1." The largest capacitor $2^{N-1}C_u$ may remain connected to VREFP.

The second MSB may then be determined in a similar manner. For example, if MSB is set to "1," SAR logic 2130 may control the bottom plate of the next largest capacitor to connect to VREFP. Alternatively, if MSB is set to "0," SAR logic 2130 may control the largest capacitor to switch to VREFN and switch the second largest capacitor (e.g., capacitor $2^{N-2}C_u$) to VREFP. The comparator can compare the output of CDAC 2110 (Vx) and VCM. The second MSB may be set to either "0" or "1" based on the result of the comparison. ADC 2100 may determine the value of each subsequent bit in the digital output in this manner. The combination of these bits forms the digital representation of the analog input signal.

The accuracy of a SAR ADC is primarily limited by the linearity of the CDAC array. The binary-weighted capacitive DAC typically has a large DNL (differential non-linearity) error, which is given by the following equation:

$$\sigma_{DNL,mid} = \sqrt{2^N - 1}\,\frac{\sigma_u}{C_u}, \tag{1}$$

where $\sigma_u$ is the standard deviation of the capacitor mismatch and the $C_u$ is the unit capacitor size.

For an existing SAR ADC sampling the input signal to the bottom plate of an 8-bit CDAC array, the DNL error is given by:

$$\sigma_{DNL,mid} = \sqrt{2^8 - 1}\,\frac{\sigma_u}{C_u} = \sqrt{255}\,\frac{\sigma_u}{C_u} \approx 16\frac{\sigma_u}{C_u}. \tag{2}$$

To minimize the DNL error, it is necessary to reduce the capacitor mismatch $$\left(\frac{\sigma_u}{C_u}\right).$$

This requires using a large unit capacitor size $C_u$ in the capacitive DAC, which comes at the cost of a large overall ADC area. Although it is possible to improve the CDAC linearity by using calibration or redundancy in the traditional DAC design, applying these techniques in the SAR ADC design is complicated because of the bit cycling operations in the conventional SAR ADCs.

Figure 2B:
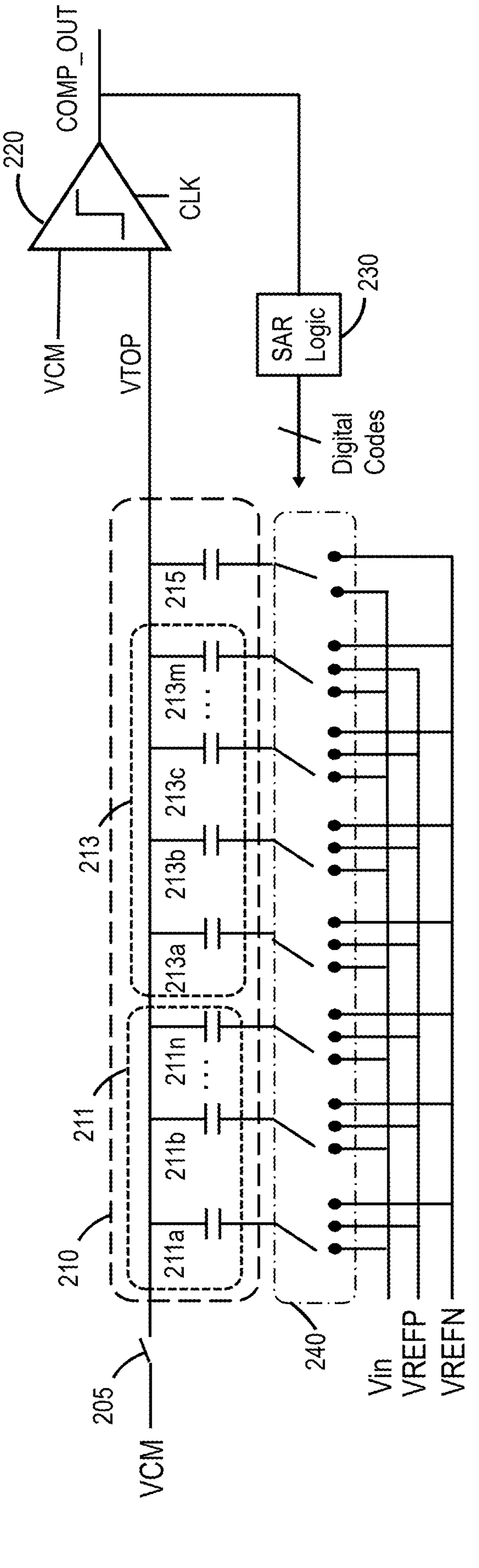
FIG. 2B is a schematic diagram illustrating an example SAR ADC implementing a bottom-plate sampling scheme in accordance with some implementations of the present disclosure.

FIG. 2B is a schematic diagram illustrating an example successive approximation register (SAR) analog-to-digital converter (ADC) 200 implementing a bottom-sampling scheme in accordance with some implementations of the present disclosure.

As shown, ADC 200 may include a CDAC 210, a comparator 220, a SAR logic 230, and switches 240. CDAC 210 may include an array of unary-weighted capacitors 211 (capacitors 211*a*, 211*b*, . . . , 211*n*) and an array of binary-weighted capacitors 213 (capacitors 213*a*, 213*b*, 213*c*, . . . , 213*m*). Unary-weighted capacitors 211 have the same capacitor value. Binary-weighted capacitors 213 are binary-weighted, each with a capacitor value that is twice the value of the next smaller capacitor in the array. The capacitor value of each unary-weighted capacitor 211 may be twice the capacitor value of the largest capacitor in binary-weighted capacitors 213. In some embodiments, CDAC 210 may further include a capacitor 215. The capacitance value of capacitor 215 may be equal to the smallest unit capacitance in the binary-weighted capacitors 213. The capacitors in CDAC 210 are connected in parallel. In some embodiments, CDAC 210 may be and/or include a CDAC 300 as described in connection with FIG. 3 below.

The top plate of each capacitor in CDAC 210 may be connected to a common point and selectively connected to a common mode voltage VCM via a switch 205. The bottom plate of each unary-weighted capacitor 211 and binary-weighted capacitor 213 may be selectively connected to a first voltage VREFP (e.g., a positive reference voltage), a second voltage VREFN (e.g., a negative reference voltage), and/or an analog input Vin via switches 240. This selective connection may enable CDAC 210 to function as a capacitive voltage divider and adjust the voltage at the top plate (VTOP) in response to the digital codes provided by the SAR logic 230.

CDAC 210 may include any suitable number of unary-weighted capacitors and binary-weighted capacitors for implementing an ADC with the desirable linearity and chip area. As an example, CDAC 210 may include a CDAC 300 of FIG. 3 (three unary-weighted capacitors having a capacitor value of 64C and binary-weighted capacitors having capacitor values of 32C, 16C, 8C, 4C, 2C, and C, respectively) for implementing an 8-bit CDAC array for an 8-bit ADC. As another example, CDAC 210 may include seven unary-weighted capacitors with a capacitor value of 32C and binary-weighted capacitors of capacitor values 16C, 8C, 4C, 2C, and C to implement an 8-bit CDAC array for an 8-bit ADC.

Comparator 220 may include two or more inputs and an output. A first input of comparator 220 may be connected to the common point of unary-weighted capacitors 211 and binary-weighted capacitors 213 and receive the output of CDAC 210 (VTOP). A second input of comparator 220 may be connected to the common mode voltage (VCM). In some embodiments, the common mode voltage may be a midpoint voltage reference, corresponding to half of the full-scale range of ADC 200. In some embodiments, the common mode voltage may be different from the midpoint voltage reference. Comparator 220 may produce a comparator output (COMP_OUT) indicative of the result of a comparison of the common mode voltage and the output voltage of CDAC 210.

SAR logic 230 may include a register, a control logic, and/or any other suitable component for controlling CDAC 210 and comparator 220 to perform a successive approximation conversion of the analog input into a digital output signal. The digital output may be a digital representation of the analog input.

Converting the analog input Vin into a digital output may involve a sampling phase and a plurality of bit-cycling phases. During the sampling phase, SAR logic 230 may provide a digital code to switches 240 to connect the bottom plate of each capacitor in CDAC 210 to the analog input Vin. Meanwhile, the top plates of the capacitors in CDAC 210 may be connected to the common mode voltage via switch 205. After the sampling phase, the top plates of the capacitors in CDAC 210 may be disconnected from the common mode voltage (VCM) while all the switches connecting the bottom plates are switched from the analog input Vin to the second voltage VREFN. This may push the voltage on the top plate to switch from VCM to VCM−Vin.

During the bit-cycling phases, the SAR logic 230 may perform a successive approximation process to sequentially determine the value of each bit of the digital output, starting from the most significant bit (MSB) down to the least significant bit (LSB). In particular, SAR logic 230 may generate a plurality of digital codes to control CDAC 210 to produce a sequence of reference voltages. Each digit of a digital code generated by SAR logic 230 may control the switch connection of a respective capacitor in CDAC 210 to either VREFP or VREFN. For example, a first digit, a second digit, and a third digit of the digital code may control the switch connection to a first capacitor, a second capacitor, and a third capacitor of unary-weighted capacitors 211, respectively. The (n+m)th digit may correspond to control the switch connection to capacitor 213*m*. In one implementation, the first capacitor, the second capacitor, and the third capacitor of unary-weighted capacitors 211 may be capacitors 211*a*, 211*b*, and 211*n*, respectively. In another implementation, the first capacitor, the second capacitor, and the third capacitor of unary-weighted capacitors 211 may be capacitors 211*b*, 211*n*, and 211*a*, respectively. In another implementation, the first capacitor, the second capacitor, and the third capacitor of unary-weighted capacitors 211 may be capacitors 211*n*, 211*a*, and 211*b*, respectively.

CDAC 210 may convert a digital code provided by SAR logic 230 into an analog voltage, i.e., the output voltage of CDAC 210. Comparator 220 may compare the output voltage of CDAC 210 (e.g., VTOP as shown in FIG. 2B) to the common mode voltage (VCM) and may produce an output representative of the result of the comparison. If the output voltage of CDAC 210 is higher than the common mode voltage, the comparator output is low, and the bit corresponding to the capacitor may be set to "0." If the output of CDAC 210 is less than the common mode voltage, the bit corresponding to the capacitor may be set to "1." The comparison process may be executed iteratively to decide the value of each bit of the digital output.

Figure 4:
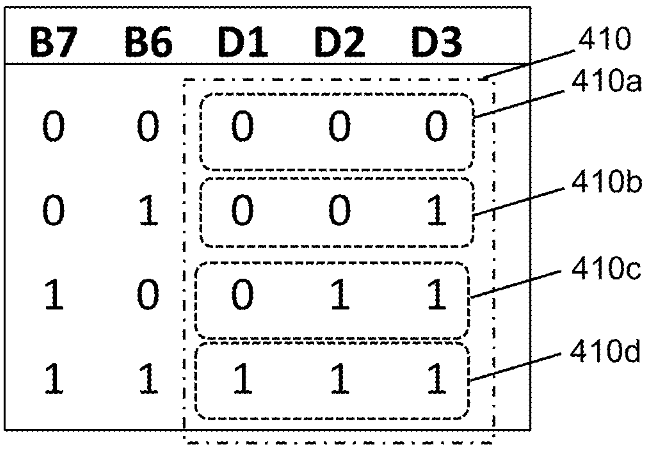
FIG. 4 is a table illustrating example correspondences between values of the most significant bit and the second most significant bit of digital output signals of an SAR ADC and bits associated with unary-weighted capacitors in accordance with some embodiments of the present disclosure.

Comparator 220 may provide its output to SAR logic 230. SAR logic 230 may selectively switch one or more subsequent capacitors in CDAC 210 based on the output of comparator 220. In some embodiments, unary-weighted capacitors 211 may be switched on (reconnecting to the first voltage) in a sequential manner. For example, the second capacitor corresponding to digit D2 in FIG. 4 of unary-weighted capacitors 211 may be switched on (e.g., reconnecting to the first voltage) only when the MSB bit (e.g., B7 as shown in FIG. 4) is "1." The first capacitor corresponding to digit D1 in FIG. 4 of unary-weighted capacitors 211 may be switched on only when both the MSB bit (B7 in FIG. 4) and the second MSB bit (B6 in FIG. 4) are "1."

SAR logic 230 may generate the digital output signal based on the plurality of successive bits. For example, SAR logic 230 may generate a first plurality of bits of the digital output signal based on the successive bits generated using unary-weighted capacitors 211 and may generate a second plurality of bits of the digital output signal based on the successive bits generated using binary-weighted capacitors 213. The first plurality of bits of the digital output signal may include the MSB, the second MSB, etc. The second plurality of bits of the digital output signal may include the LSB.

For example, the MSB and the second MSB of the digital output signal may be used to set the switch connection to the unary-weighted capacitors to the first voltage or the second voltage. In some embodiments, SAR logic 230 may output the successive bits corresponding to binary-weighted capacitors 213 as the second plurality of bits of the digital output signal.

Figure 3:
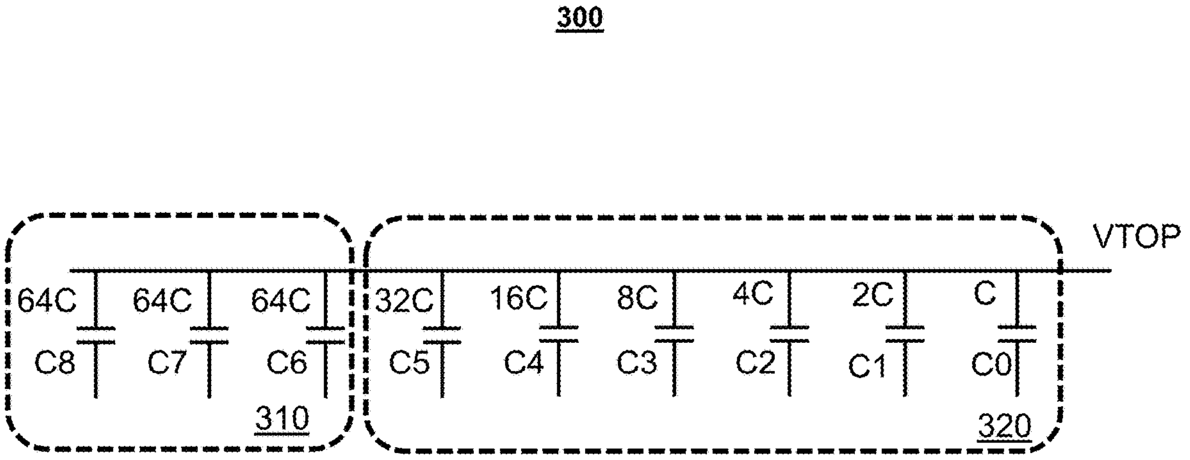
FIG. 3 is a schematic diagram illustrating an example CDAC in accordance with some implementations of the present disclosure.

FIG. 3 is a schematic diagram illustrating an example CDAC 300 in accordance with some implementations of the present disclosure.

As shown, CDAC 300 may include an array of unary-weighted capacitors 310 and an array of binary-weighted capacitors 320. Unary-weighted capacitors 310 include capacitors C8, C7, and C6. Binary-weighted capacitors 320 may include capacitors C5, C4, C3, C2, C1, and C0. The capacitor values of C8, C7, C6, C5, C4, C3, C2, C1, and C0 may be 64C, 64C, 64C, 32C, 16C, 8C, 4C, 2C, and C, respectively. In some embodiments, CDAC 300 may be used to implement a bottom-plate sampling SAR ADC, such as the ADC 200 as described in connection with FIG. 2B. Performing ADC using CDAC 300 may involve bit-cycling operations based on digital codes 410 as described in connection with FIG. 4.

FIG. 4 is a table 400 illustrating example correspondences between the values of the MSB and the second MSB of digital output signals produced by a SAR ADC and bits corresponding to unary-weighted capacitors in accordance with some embodiments of the present disclosure.

As illustrated in FIG. 4, B7 and B6 represent the MSB and the second MSB of a digital output signal produced by a SAR ADC, respectively. Each of B7 and B6 may assume a value of either "0" or "1." D1, D2, and D3 may represent three digits of digital codes 410*a*, 410*b*, 410*c*, and 410*d* (collectively referred to as digital codes 410) that are used to control the switching of three unary-weighted capacitors. A digital code 410*a-d* may correspond to a respective combination of values of B7 and B6. For example, a digital code 410*a* ("000") may correspond to a "00" combination of B7 and B6 values. A digital code 410*b* ("001") may correspond to a "01" combination of B7 and B6 values. A digital code 410*c* ("011") may correspond to a "10" combination of B7 and B6 values. A digital code 410*d* ("111") may correspond to a "11" combination of B7 and B6 values.

D1, D2, and D3 may correspond to a first unary-weighted capacitor, a second unary-weighted capacitor, and a third unary-weighted capacitor of unary-weighted capacitors 310, respectively. In some embodiments, the first unary-weighted capacitor, the second unary-weighted capacitor, and the third unary-weighted capacitor may be C8, C7, and C6 of FIG. 3, respectively. Digital codes 410 may be used to control CDAC 300 to perform bit-cycling operations. For example, all of the capacitors in CDAC 300 may be initialized (e.g., by connecting the bottom plates of the capacitors to VREFN and disconnecting the top plates of the capacitors from VCM).

If the common mode voltage provided to the comparator is higher than the first output of CDAC 300, the value of the MSB may be set to "0." Otherwise, the value of the MSB may be set to "1." Upon deciding the value of the MSB bit from the first comparison result in the first bit-cycling phase, the first unary-weighted capacitor, the second unary-weighted capacitor, and the third unary-weighted capacitor are connected to either the first voltage VREFP or the second voltage VREFN according to digital codes 410. In particular, if the MSB bit is "0," the first unary-weighted capacitor is connected to the second voltage and the second unary-weighted capacitor is connected to the second voltage. If the MSB bit is "1," the second unary-weighted capacitor is connected to the first voltage and the third unary-weighted capacitor is connected to the first voltage.

In the second bit-cycling phase in which the second MSB is determined, if the common mode voltage is not higher than the second output voltage of CDAC 300, the value of the second MSB may be set to "1." In that case, the first unary-weighted capacitor is connected to the first voltage VREFP if the MSB value was "1" and the third unary-weighted capacitor is connected to the first voltage VREFP if the MSB value was "0."

If the value of the second MSB is "0," the first unary-weighted capacitor is connected to the second voltage VREFN if the MSB value was "1" and the third unary-weighted capacitor is connected to the second voltage VREFN if the MSB value was "0." The next bit of the digital output signal may be determined using the next capacitor in the capacitive DAC (e.g., the largest binary-weighted capacitor).

Using the SAR ADC scheme described herein, the maximum DNL error occurs at the binary to unary transition point. In this 7-bit example, the DNL error is improved to:

$$\sigma_{DNL,mid} = \sqrt{2^6 - 1}\frac{\sigma_u}{C_u} = \sqrt{127}\frac{\sigma_u}{C_u} \approx 7.94\frac{\sigma_u}{C_u}. \tag{3}$$

In a capacitive DAC layout, the unary-weighted capacitors C6, C7, and C8 may be physically located in different positions. As such, the matching of each of these unary capacitors with the rest of the binary-weighted capacitors C1-C5 may be different in manufacturing environments. In some embodiments, different unary-weighted capacitors C6, C7, and C8 may be assigned as the MSB in the bit-cycling operations. For example, D1, D2, and D3 may correspond to C8, C7, and C6 of CDAC 300, respectively. The first unary-weighted capacitor, the second unary-weighted capacitor, and the third unary-weighted capacitor refer to C8, C7, and C6, respectively. As another example, D1, D2, and D3 may correspond to C6, C8, and C7 of CDAC 300, respectively. The first unary-weighted capacitor, the second unary-weighted capacitor, and the third unary-weighted capacitor refer to C6, C8, and C7, respectively. As a further example, D1, D2, and D3 may correspond to C6, C7, and C8 of CDAC 300, respectively. The first unary-weighted capacitor, the second unary-weighted capacitor, and the third unary-weighted capacitor refer to C6, C7, and C8, respectively.

FIG. 5 is a schematic diagram illustrating an example successive approximation register (SAR) analog-to-digital converter (ADC) 500 in accordance with some implementations of the present disclosure.

As shown, ADC 500 may include a CDAC 510, a comparator 520, a SAR logic 530, switches 540*a*, and switches 540*b*. CDAC 510 may include a first capacitor array 510*a* and a second capacitor array 510*b*. Each of the first capacitor array 510*a* and the second capacitor array 510*b* may include a plurality of unary-weighted capacitors connected in parallel (e.g., capacitors C3-a, C2-a, and C1-a in the first capacitor array 510*a*, capacitors C3-b, C2-b, and C1-b in the second capacitor array 510*b*) and a plurality of binary-weighted capacitors connected in parallel (capacitors B4-a, B3-a, B2-a, B1-a, . . . , and B0-a in the first capacitor array 510*a*, capacitors B4-b, B3-b, B2-b, B1-b, . . . , and B0-b in the second capacitor array 510*b*). The unary-weighted capacitors C3-a, C2-a, and C1-a have the same capacitor value. The unary-weighted capacitors C3-b, C2-b, and C1-b have the same capacitor value. The binary-weighted capacitors are binary-weighted, each with a capacitor value that is twice the value of the next smaller capacitor in the array.

The first capacitor array 510*a* and the second capacitor array 510*b* may include any suitable number of unary-weighted capacitors and binary-weighted capacitors for implementing an ADC with the desirable linearity and chip area. For example, each of the first capacitor array 510*a* and the second capacitor array 510*b* may include three unary-weighted capacitors having a capacitor value of 32C and binary-weighted capacitors having capacitor values of 16C, 8C, 4C, 2C, and C, respectively, where C represents the unit capacitance.

The top plate of each capacitor in the first capacitor array 510*a* and the second capacitor array 510*b* may be connected to a common point and may be selectively connected to a common mode voltage (VCM) via a switch 505*b*. The common mode voltage may be a midpoint voltage reference, corresponding to half of the full-scale range of ADC 500. The full-scale range of ADC 500 is referred to as Vmax herein. The bottom plate of each capacitor in CDAC 510 may be selectively connected to a first voltage VREFP or a second voltage VREFN via switches 540*a*-540*b* based on digital codes provided by the SAR logic 530. This selective connection may enable the CDAC to function as a capacitive voltage divider and adjust the output voltage at the top plate (VTOP) in response to the digital codes provided by the SAR logic 530.

Comparator 520 may produce a comparator output (COMP_OUT) indicative of the result of a comparison of a first input 521 and a second input 523. The output voltage VTOP of CDAC 510 may be provided to the comparator as the first input.

SAR logic 530 may include a register, a control logic, and/or any other suitable component for controlling switches 540*a*-540*b*, CDAC 510, and comparator 520 to perform a successive approximation conversion of the analog input Vin into a digital output. The digital output may be a digital representation of the analog input. The process for generating each bit of the digital output may involve comparing the sampled input signal with a series of reference voltages output by the CDAC 510 to determine each bit of the digital output, from the MSB to the LSB. These reference voltages are dynamically chosen to successively divide the full voltage range of ADC 500 into increasingly finer segments. Beginning with a first reference voltage at the midpoint of the ADC's full-scale value, Vmax, each subsequent voltage is selected to halve the voltage range under consideration based on the results of the previous comparisons, thus systematically refining the resolution and accuracy of the digital output with each step. The SAR logic 530 may increase the VTOP voltage by switching the bottom plates of one or more additional capacitors from the second voltage to the first voltage. Alternatively, the SAR logic 530 may decrease the VTOP voltage by switching the bottom plates of one or more additional capacitors from the first voltage to the second voltage. In particular, SAR logic 530 may generate a sequence of digital codes to perform a bit-cycling process in which each bit of the digital output is generated. The digital codes may control the bottom plate of each capacitor in CDAC 510 to be selectively connected to either the first voltage VREFP or the second voltage VREFN via a respective switch 540*a*-540*b* to generate a plurality of reference voltages at VTOP. Each of the digital codes may include a sequence of digits "0" and/or "1." Each of the digits controls the switch connection to a respective capacitor. For example, when a digit "0" is assigned to a capacitor, the bottom plate of the capacitor may be disconnected from the first voltage and may be connected to the second voltage. When a digit "1" is assigned to the capacitor, the bottom plate of the capacitor may be connected to the first voltage.

At the start of an analog-to-digital conversion process, SAR logic 530 may generate one or more digital codes to set the capacitors in CDAC 510 to an initial state. For example, the digital codes may be provided to the switches 540*a* to control the capacitors in the first capacitor array 510*a* to be connected to the first voltage VREFP and may be provided to the switches 540*b* to control the capacitors in the second capacitor array 510*b* to be connected to the second voltage VREFN. As a more particular example, a digital code "11111111" may be generated by SAR logic 530 and may be provided to the switches 540*a* to control the bottom plates of the capacitors in the first capacitor array 510*a* to be connected to the first voltage. A digital code "00000000" may be generated by SAR logic 530 and may be provided to switches 540*b* to cause the bottom plates of the capacitors in the second capacitor array 510*b* to be connected to the second voltage.

During a sampling phase, switches 505*a* and 505*b* may be closed. The analog input Vin may be sampled and provided to comparator 520 as the second input. The top plates of the capacitors in CDAC 510 may be connected to VCM. Switches 505*a* and 505*b* may then be opened after the sampling phase to initialize a bit-cycling process. The output voltage VTOP of the initialized CDAC 510 (also referred to as the "first output of the CDAC") may be provided to the comparator 520 as the first reference voltage. Comparator 520 may compare the sampled input voltage and the first reference voltage and may generate an output COMP_OUT representative of the result of the comparison (also referred to as the "first output of the comparator"). In some embodiments in which the first output of the comparator 520 indicates that the sampled input signal is higher than the first reference voltage, the SAR logic 530 may set the MSB of the digital output as "1." Alternatively, the MSB of the digital output may be set as "0" if the first output of comparator 520 indicates that the sampled input signal is not higher than the first reference voltage.

In view of the first output of comparator 520, SAR logic 530 may generate a digital code to control CDAC 510 to produce an output voltage VTOP that represents the mid-point of the remaining voltage range (e.g., ¾ Vmax if the MSB is “1” and ¼ Vmax if the MSB is “0” to implement an 8-bit ADC). For example, in view of the sample input signal being higher than the first output of the comparator 520, SAR logic 530 may generate a digital code to switch the bottom plates of unary capacitors C2-b and C1-b from the second voltage to the first voltage. For example, a digital code “01100000” may be generated and provided to switches 540*b*. The connections between the bottom plates of the capacitors in the first capacitor array 510*a* and the first reference voltage are not changed. The output voltage of the CDAC 510 (also referred to as the “second output voltage of the CDAC”) may then be provided to the comparator 520 as a second reference voltage. Comparator 520 may compare the sampled input signal with the second reference voltage and generate a second output indicative of the result of the comparison.

If the second output of comparator 520 indicates that the sampled input signal is higher than the second reference voltage, the second MSB of the digital output may be set as “1.” In addition, SAR logic 530 may generate a digital code to switch the bottom plate of the unary capacitor C3-b from the second voltage to the first voltage. The connections between the bottom plates of the other capacitors in CDAC 510 and the first reference voltage or the second reference voltage are not changed. For example, a digital code “11100000” may be provided to the switches 540*b*. If the second output of comparator 520 indicates that the sampled input is not higher than the second reference voltage, the second MSB of the digital output may be set as “0.” In addition, the SAR logic 530 may generate a digital code to switch the unary capacitor C2-b in the second capacitor array 510*b* from the first voltage to the second voltage. The connections between the bottom plates of the other capacitors in CDAC 510 and the first reference voltage or the second reference voltage are not changed. For example, a digital code “00100000” may be provided to the switches 540*b*.

In some embodiments in which the first output of comparator 520 indicates that the sampled input signal is not higher than the first reference voltage, SAR logic 530 may set the MSB of the digital output as “0.” In view of the first output of the comparator 520, SAR logic 530 may generate a digital code to connect the bottom plates of the unary capacitor C3-a and C2-a to the second voltage while the bottom plates of the other capacitors in the first capacitor array 510*a* remain connected to the first voltage. For example, a digital code “00111111” may be provided to the switches 540*a*. Each of the capacitors in the second capacitor array 510*b* remains connected to the second voltage. The output voltage VTOP may then be provided to comparator 520 as a reference voltage (also referred to as the “third reference voltage”).

Comparator 520 may compare the sampled input signal with the third reference voltage and may generate an output indicative of the result of the comparison (also referred to as the “third output” of the comparator 520). In some embodiments in which the third output of the comparator 520 indicates that the sampled analog input is higher than the third reference voltage, the SAR logic 530 may set the second MSB of the digital output as “1.” In view of the third comparison result, comparator 520 may generate a digital code to switch the bottom plate of the unary capacitor C2-a in the first capacitor array 510*a* to the first voltage. Alternatively, the second MSB of the digital output may be set to “0” in some embodiments in which the third output of comparator 520 indicates that the sampled input signal is not higher than the third reference voltage. Furthermore, the SAR logic 530 may switch the bottom plate of the unary capacitor C1-a to the second voltage (e.g., by providing a digital code “00011111” to the switches 540*a*.

The subsequent bits of the digital output may be determined by sequentially executing the bit-cycling method previously outlined. Specifically, the SAR logic 530 dynamically adjusts the CDAC 510 to generate reference voltages that sequentially halve the current voltage range, based on the values of the preceding bits of the digital output. This meticulous procedure facilitates a binary search across the ADC 500’s entire voltage range, effectively narrowing down to the accurate digital representation of the input signal.

Figure 6:
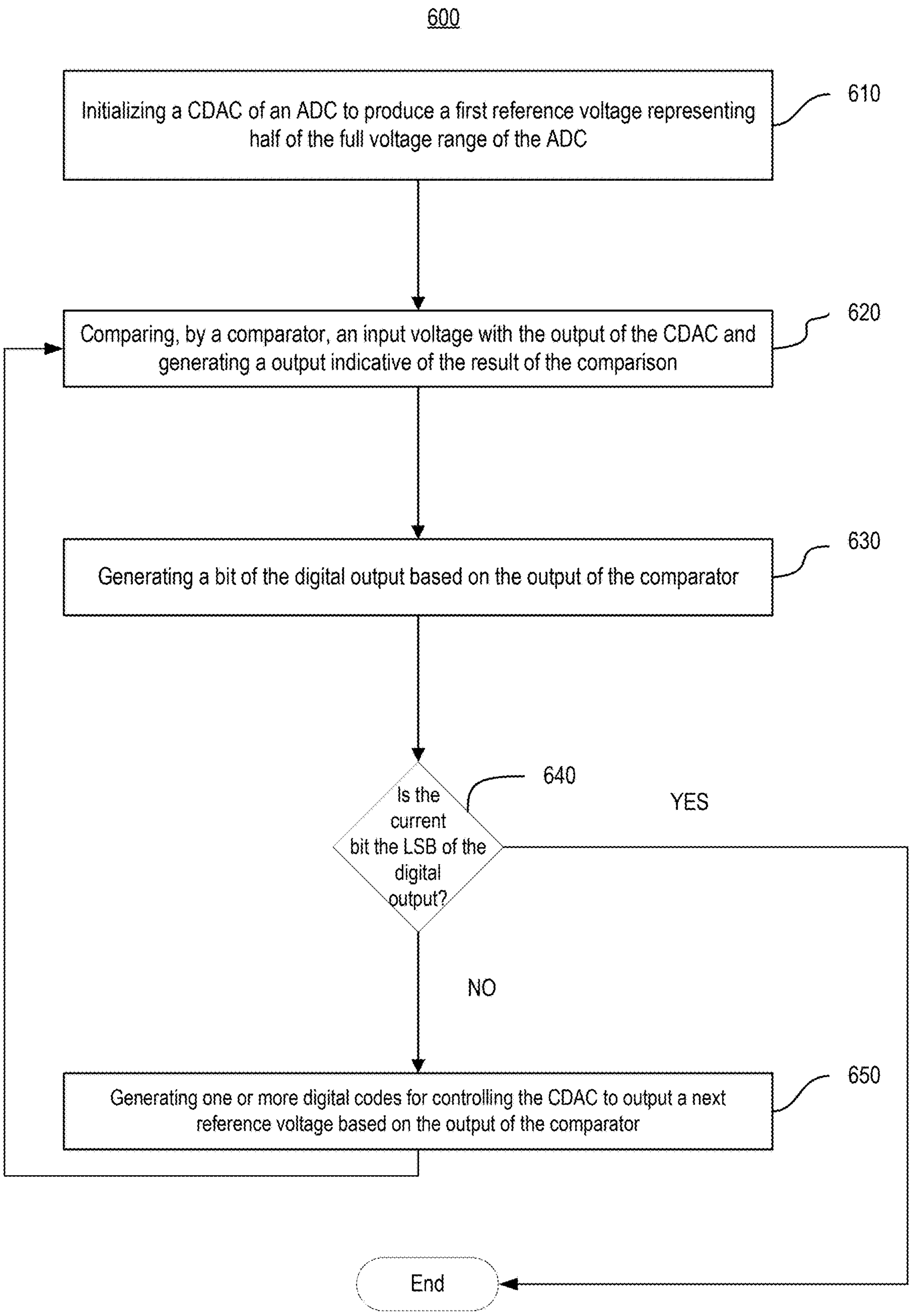
FIG. 6 is a flowchart illustrating an example process for performing bit-cycling in accordance with some embodiments of the present disclosure.

FIG. 6 is a flowchart illustrating an example process 600 for performing successive approximation conversion using a SAR ADC in accordance with some embodiments of the present disclosure. Process 600 may be implemented using a SAR ADC as described in connection with FIG. 5 above. The SAR ADC may include a CDAC that further includes a first capacitor array (e.g., the first capacitor array 510*a*) and a second capacitor array (e.g., the second capacitor array 510*b*).

At block 610, the CDAC may be initialized to produce a first reference voltage representing half of the voltage range of the ADC. For example, the top plates of the capacitors in the CDAC may be connected to a common mode voltage. The bottom plate of each capacitor in the first capacitor array may be connected to a first voltage VREFP. The bottom plate of each capacitor in the second capacitor array may be connected to the second voltage VREFN.

Initializing the CDAC may involve generating, using a SAR logic (e.g., the SAR logic 530 of FIG. 5) one or more digital codes for controlling the bottom plates of the capacitors in the first capacitor array to be connected to the first voltage and to control the bottom plates of the capacitors in the second capacitor array to be connected to the second voltage. The output of the CDAC after the initialization (the “first output of the CDAC”) may be provided to the comparator as the first reference voltage.

At block 620, a comparator may compare an input voltage with the output voltage of the CDAC and may generate an output indicative of the result of the comparison. The input voltage may represent the sampled analog input. For example, the comparator may generate a first output indicating whether the input voltage is higher than the output voltage of the CDAC (i.e., the first reference voltage).

At block 630, a bit of the digital output is generated based on the output of the comparator. For example, the SAR logic may set the MSB of the digital output as “1” if the first output of the comparator indicates that the sampled analog input is higher than the first output voltage of the CDAC. The SAR logic may set the MSB of the digital output as “0” if the first output of the comparator indicates that the sampled analog input is not higher than the first output voltage of the CDAC.

At block 640, a determination can be made as to whether the current bit determined at block 630 is the LSB of the digital output. If the current bit is the LSB of the digital output, process 600 may conclude.

Alternatively, if the current bit is not the LSB of the digital output, process 600 may proceed to block 650. At block 650, the SAR logic may generate one or more digital codes for controlling the CDAC to output a next reference voltage based on the output of the comparator. For example, the SAR logic may generate one or more digital codes for switching one or more capacitors in the CDAC from the second voltage to the first voltage to increase the reference voltage in view that the first output of the comparator indicates that the sampled analog input is higher than the first output voltage of the CDAC. As another example, the SAR logic may generate one or more digital codes for switching a capacitor in the CDAC from the first voltage to the second voltage to decrease the reference voltage if the first output of the comparator indicates that the sampled analog input is not higher than the first output voltage of the CDAC. The digital codes may be generated as described in connection with FIG. 5 above.

Process 600 may then loop back to block 620 and may compare the sampled input signal with the current output voltage of the CDAC. For example, the comparator may generate a second output indicating whether the sampled analog input is higher than a second output of the CDAC. The SAR logic may generate the second MSB of the digital output based on the second output of the comparator (e.g., by performing the operations as described in connection with FIG. 5 above). Each bit of the digital output may be generated by executing process 600 in an iterative manner.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, the use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:

a capacitive digital-to-analog converter (CDAC) that comprises:

a first capacitor array, the first capacitor array comprising a first plurality of unary-weighted capacitors having the same capacitor value and a first plurality of binary-weighted capacitors, wherein the capacitor value of the first plurality of unary-weighted capacitors is twice that of the largest capacitor of the first plurality of binary-weighted capacitors;

a comparator, wherein a first input of the comparator is connected to an output voltage of the CDAC, and wherein a second input of the comparator is selectively connected to a sampled analog input; and a successive approximation register (SAR) logic configured to control the CDAC and the comparator to perform a successive approximation conversion of the analog input into a digital output.

2. The apparatus of claim 1, wherein top plates of the first plurality of unary-weighted capacitors and the first plurality of binary-weighted capacitors are connected to a common mode voltage, and wherein a bottom plate of each of the first plurality of unary-weighted capacitors and the first plurality of binary-weighted capacitors is selectively connected to a first voltage or a second voltage via a first plurality of switches.

3. The apparatus of claim 2, wherein the CDAC further comprises a second capacitor array, the second capacitor array comprising a second plurality of unary-weighted capacitors having the same capacitor value and a second plurality of binary-weighted capacitors.

4. The apparatus of claim 3, wherein the capacitor value of the second plurality of unary-weighted capacitors is twice that of the largest capacitor of the second plurality of binary-weighted capacitors.

5. The apparatus of claim 4, wherein top plates of the second plurality of unary-weighted capacitors and the second plurality of binary-weighted capacitors are connected to the common mode voltage, and wherein a bottom plate of each of the second plurality of unary-weighted capacitors and the second plurality of binary-weighted capacitors is selectively connected to the first voltage or the second voltage via a second plurality of switches.

6. The apparatus of claim 5, wherein, to perform the successive approximation conversion of the analog input into the digital output, the SAR logic is further configured to:

generate a first digital code to control the bottom plates of the first plurality of unary-weighted capacitors and the first plurality of binary-weighted capacitors to be connected to the first voltage; and generate a second digital code to control the bottom plates of the second plurality of unary-weighted capacitors and the second plurality of binary-weighted capacitors to be connected to the second voltage.

7. The apparatus of claim 6, wherein the comparator is configured to generate a first output indicative of whether the sampled analog input is higher than the output voltage of the CDAC, wherein the SAR logic is configured to generate the most significant bit of the digital output based on the first output of the comparator.

8. The apparatus of claim 7, wherein, in view that the first output of the comparator indicates that the sampled analog input is higher than the output voltage of the CDAC, the SAR logic is further configured to generate a third digital code to control one or more of the second plurality of unary-weighted capacitors to be connected to the first voltage.

9. The apparatus of claim 7, wherein, in view that the first output of the comparator indicates that the sampled analog input is not higher than the output voltage of the CDAC, the SAR logic is further configured to generate a fourth digital code to control one or more of the first plurality of unary-weighted capacitors to be connected to the second voltage.

10. A method for performing analog-to-digital conversion, comprising:

initializing, by a SAR logic of an analog-to-digital converter, a CDAC to produce a first reference voltage representing half of a voltage range of the analog-to-digital converter, wherein the analog-to-digital converter comprises a first capacitor array and a second capacitor array, wherein the first capacitor array comprises a first plurality of unary-weighted capacitors having the same capacitor value and a first plurality of binary-weighted capacitors, wherein the second capacitor array comprises a second plurality of unary-weighted capacitors having the same capacitor value and a second plurality of binary-weighted capacitors, wherein a top plate of each capacitor in the CDAC is selectively connected to a common mode voltage, and wherein a bottom plate of each capacitor in the CDAC is selectively connected to a first voltage or a second voltage;

generating, by a comparator of the analog-to-digital converter, a first output indicating whether an input voltage is higher than the first reference voltage; and determining the most significant bit of a digital output based on the first output of the comparator, wherein the digital output is a digital representation of an analog input, wherein the input voltage is a sampled analog input.

11. The method of claim 10, wherein the capacitor value of the first plurality of unary-weighted capacitors is twice that of the largest capacitor of the first plurality of binary-weighted capacitors.

12. The method of claim 11, wherein the capacitor value of the second plurality of unary-weighted capacitors is twice that of the largest capacitor of the second plurality of binary-weighted capacitors.

13. The method of claim 10, wherein top plates of the first plurality of unary-weighted capacitors and the first plurality of binary-weighted capacitors are connected to a common mode voltage.

14. The method of claim 13, wherein top plates of the second plurality of unary-weighted capacitors and the second plurality of binary-weighted capacitors are connected to the common mode voltage.

15. An apparatus, comprising:

a first capacitor array comprising a first plurality of binary-weighted capacitors and a first plurality of unary-weighted capacitors having the same capacitor value;

a second capacitor array comprising a second plurality of binary-weighted capacitors and a second plurality of unary-weighted capacitors having the same capacitor value;

a comparator, wherein a first input of the comparator is connected to an output voltage of the first capacitor array, and wherein a second input of the comparator is connected to an output voltage of the second capacitor array; and a successive approximation register (SAR) logic configured to control the first capacitor array, the second capacitor array, and the comparator to perform a successive approximation conversion of an analog input into a digital output.

16. The apparatus of claim 15, wherein the capacitor value of the first plurality of unary-weighted capacitors is twice that of the largest capacitor of the first plurality of binary-weighted capacitors.

17. The apparatus of claim 15, wherein top plates of capacitors in the first capacitor array are selectively connected to a positive input voltage, wherein top plates of capacitors in the second capacitor array are selectively connected to a negative input voltage, and wherein a differential signal representative of the analog input comprises the positive input voltage and the negative input voltage.

18. The apparatus of claim 17, wherein bottom plates of the first capacitor array are selectively connected to a first voltage or a second voltage via a first plurality of switches, and wherein bottom plates of the second capacitor array are selectively connected to the first voltage or the second voltage via a second plurality of switches.

* * * * *